(12) United States Patent
Lee

(10) Patent No.: US 6,412,041 B1
(45) Date of Patent: Jun. 25, 2002

(54) REAL TIME PROCESSING METHOD OF A FLASH MEMORY

(75) Inventor: Sung Kyum Lee, Seoul (KR)

(73) Assignee: Samsung Electronics Co., Ltd., Kyungki-Do (KR)

( * ) Notice: Subject to any disclaimer, the term of this patent is extended or adjusted under 35 U.S.C. 154(b) by 0 days.

(21) Appl. No.: 09/494,380

(22) Filed: Jan. 31, 2000

(30) Foreign Application Priority Data

Sep. 7, 1999 (KR) .............................................. 99-37976

(51) Int. Cl.$^7$ .......................... G06F 12/00; G11C 16/02
(52) U.S. Cl. ...................................... 711/103; 711/167
(58) Field of Search ............................. 711/103, 5, 150, 711/152, 167

(56) References Cited

U.S. PATENT DOCUMENTS

| | | | | |
|---|---|---|---|---|
| 5,509,134 A | * | 4/1996 | Fandrich et al. | 711/103 |
| 6,151,657 A | * | 11/2000 | Sun et al. | 711/103 |
| 6,189,070 B1 | * | 2/2001 | See et al. | 711/103 |
| 6,260,103 B1 | * | 7/2001 | Alexis et al. | 711/103 |
| 6,279,070 B1 | * | 8/2001 | Jeong et al. | 711/103 |
| 6,301,635 B2 | * | 10/2001 | Bothwell et al. | 711/103 |

* cited by examiner

Primary Examiner—Do Hyun Yoo
Assistant Examiner—Gary J. Portka
(74) Attorney, Agent, or Firm—Sughrue Mion, PLLC

(57) ABSTRACT

A real time processing method of a flash memory is disclosed, which includes the steps of (1) determining whether an access to the flash memory is possible when an access to a block of the flash memory is requested in order to perform a read/write operation; (2) determining whether an erase operation is performed in the flash memory if the access to the flash memory is impossible in the step (1), and suspending the erase operation if the erase operation is being performed; (3) performing the read/write operation by accessing the flash memory if the access to the flash memory is possible in the step (1) or if the erase operation in the flash memory is suspended in the step (2); and (4) resuming the erase operation which is suspended in the step (2) if the step (3) is finished. If an access to a block of a flash memory is requested for a read/write operation while an erase operation is performed with respect to a different block of the same memory, the erase operation is instantly suspended, the read/write operation is performed first, and then the erase operation is resumed. This allows. For a reduction in the access delay and the access error, and for, a data read/write operation to be processed in real time.

3 Claims, 6 Drawing Sheets

U.S. APP NO. 09/494,380

U.S. APP NO. 09/494,380

REAL TIME PROCESSING METHOD OF A FLASH MEMORY

BACKGROUND OF THE INVENTION

1. Field of the Invention

The present invention relates to a real time processing method of a flash memory, and more particularly to a real time processing method of a flash memory to effectively provide a simultaneous access to different banks as well as the same bank of the flash memory.

2. Description of the Prior Art

Flash memory, which Was developed by Intel corporation for the first time in the early 1980's is a type of EPROM which needs no additional hardware for a program. Further, data erase or write operation from or to the memory can be performed by software.

Since such flash memory is non-volatile and can be programed, in recent fews years. it is widely used as a program/data storage unit for mobile appliances such as mobile phones and PDAs.

Flash memory is classified into a single bank flash memory or a double bank flash memory according to its bank structure. In general, the single bank flash memory cannot perform two different operations at the same time, whereas the double bank flash memory can perform two different operations simultaneously since it has two banks each of which performs one operation. Therefore, the double bank flash memory can reduce access error and access time when compared to the single bank flash memory.

Here, access error means an error occurring when that data is not stored in the flash memory, even under a store command from an application program.

Further, in order to prevent access error, an access control is performed that does not permit more than two accesses simultaneously in the same bank. A central processing unit waits till an erase operation, with respect to a block, is finished because a read or a write (read/write) operation may not be performed, which is called an access delay.

FIG. 1 illustrates the structure of a single bank flash memory and a double bank flash memory in general. A block means an erasion block which is a unit that may be erased at once.

As shown in FIG. 1A, a single bank flash memory has several erasion blocks in a flash memory package. As shown in FIG. 1B, a double bank flash memory has two banks, each of which has several erasion blocks.

In the state that one operation is not completed in a block, a single bank flash memory cannot perform other operations in the block as well as in other blocks.

For example, as shown in FIG. 1C, while an erase operation is being performed with respect to the block of number 1 in a single bank flash memory, a write operation cannot be performed to the block of number 7.

Further, in a double bank flash memory, while an operation is carried out in a bank, another operation can be performed in a different bank even though another operation cannot be carried out with respect to the same bank.

For example, as shown in FIG. 1D, while an erase operation is being carried out to the block of number 3 in the first bank, a write operation can be performed to the block of number 5 in the second bank so that the access error and the access delay can be reduced.

However, while the erase operation is being carried out to the block of number 3 in the first bank, a write operation cannot be performed to the block of number 2 in the first bank. That is, the write operation can only be performed after the erase operation is completed, and thereby lengthen the access delay time period.

In general, since a flash memory has an erase operation speed lower than a read and a write operation speed, the erase operation causes the access delay time to be lengthend.

For example, as shown in FIG. 1D, in order to update data in the block number 2 in the first bank, necessary steps are as follows.

FIG. 2 is a flow chart for explaining the operations of a general double bank flash memory. As shown in FIG. 2, if an access to a certain block of a double bank flash memory is requested in order to carry out a read/write operation (S1), a determination is made as to which bank of the first bank and the second bank has a block to which the access is requested (S2). A determination is made whether the access to the bank is possible, that is, whether a read, a write, or an erase operation is being carried out to the bank (S3).

At this time, if the access is impossible since a read, a write, or an erase operation is being carried out to the bank, the access is delayed until the access is possible with the read, write, or erase operation with respect to the bank completed (S4). After the read, write, or erase operation is completed, the read/write operation is performed by accessing the bank (S5).

At this time, if about one and a half second time period is necessary for data to be stored in one block of a flash memory through an application program, an access delay time period of one and a half seconds times the number of blocks to each of which an erase operation is to be performed is necessary for storing data in the several blocks.

As stated above, in a conventional flash memory, while an erase operation to a bank is being carried out, if a read or a write operation to the same block or to another block is to be performed, since the read or the write operation is performed after the erase operation completion, an access delay time period is lengthened.

SUMMARY OF THE INVENTION

Accordingly, in order to solve the above problem, it is an object of the present invention to provide a real time processing method of a flash memory effectively capable of supporting simultaneous accesses to different banks as well as to same bank in a flash memory.

In order to achieve the above object, the method according to the present invention comprises the steps of (1) determining whether an access to the flash memory is possible if an access to a block of the flash memory is requested in order to perform a read/write operation; (2) determining whether an erase operation is performed in the flash memory if the access to the flash memory is impossible in the step (1), and suspending the erase operation if the erase operation is being performed;

(3) performing the read/write operation by accessing the flash memory if the access to the flash memory is possible in the step (1) or if the erase operation in the flash memory is suspended in the step (2); and (4) resuming the erase operation which is suspended in the step (2) if the step (3) is finished.

Therefore, if an access to a block of a flash memory is requested for a read/write operation while an erase operation is performed with respect to a different block of the same memory, the erase operation is instantly suspended, the read/write operation is performed first, and then the erase operation is resumed, to thereby reduce an access delay and an access error. Therefore, a data read/write operation is processed in real time.

BRIEF DESCRIPTION OF THE DRAWINGS

The above object and other advantages of the present invention will become more apparent by describing in detail a preferred embodiment thereof with reference to the attached drawings, in which.

DETAILED DESCRIPTION OF THE PREFERRED EMBODIMENT

Hereinafter, an embodiment of the present invention will be described in detail with reference to the accompanying drawings.

Figure 4A:
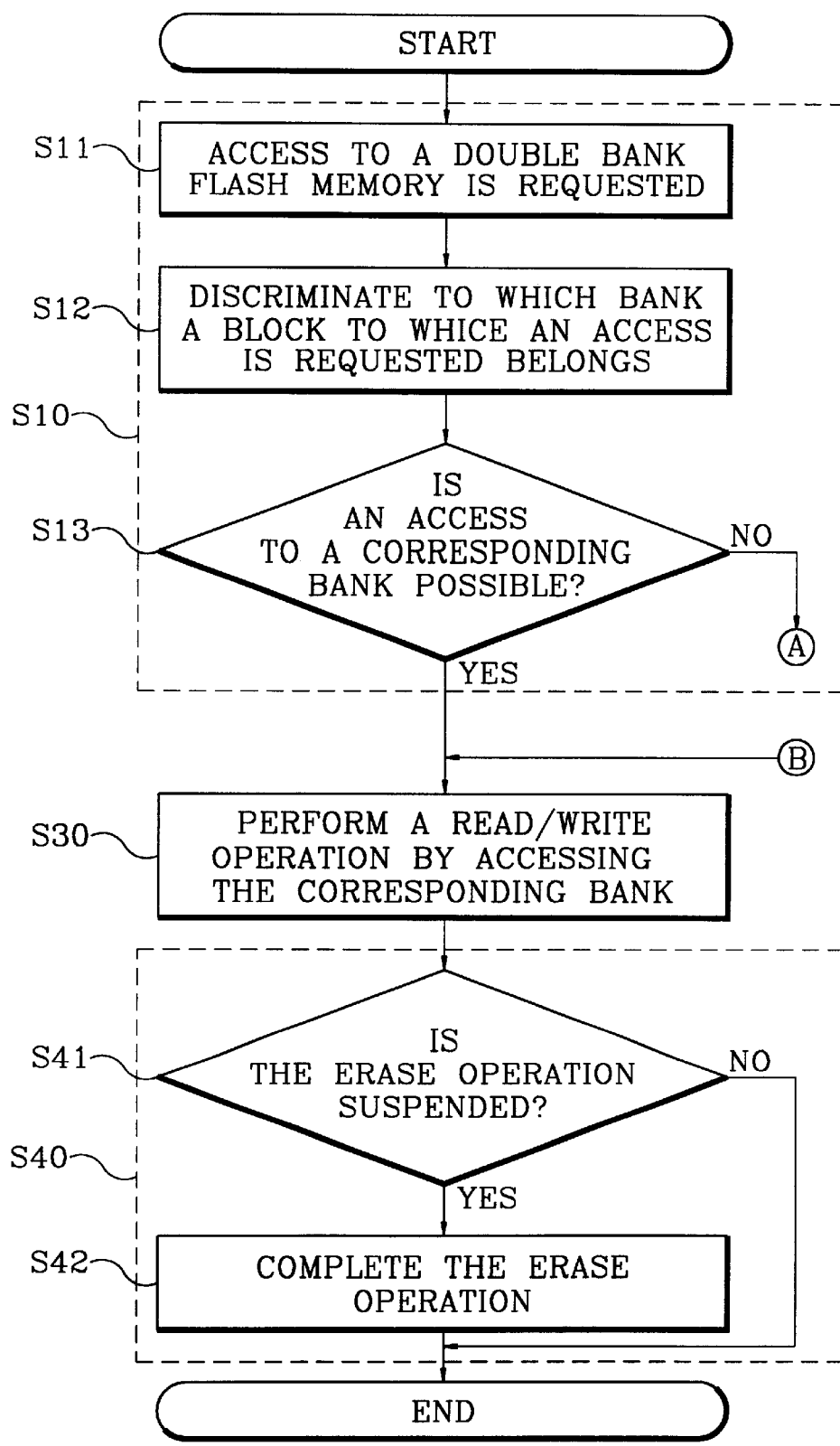
FIGS. 4A and 4B are flow charts for explaining a real time processing method of a flash memory according to an embodiment of the present invention.
Figure 4B:
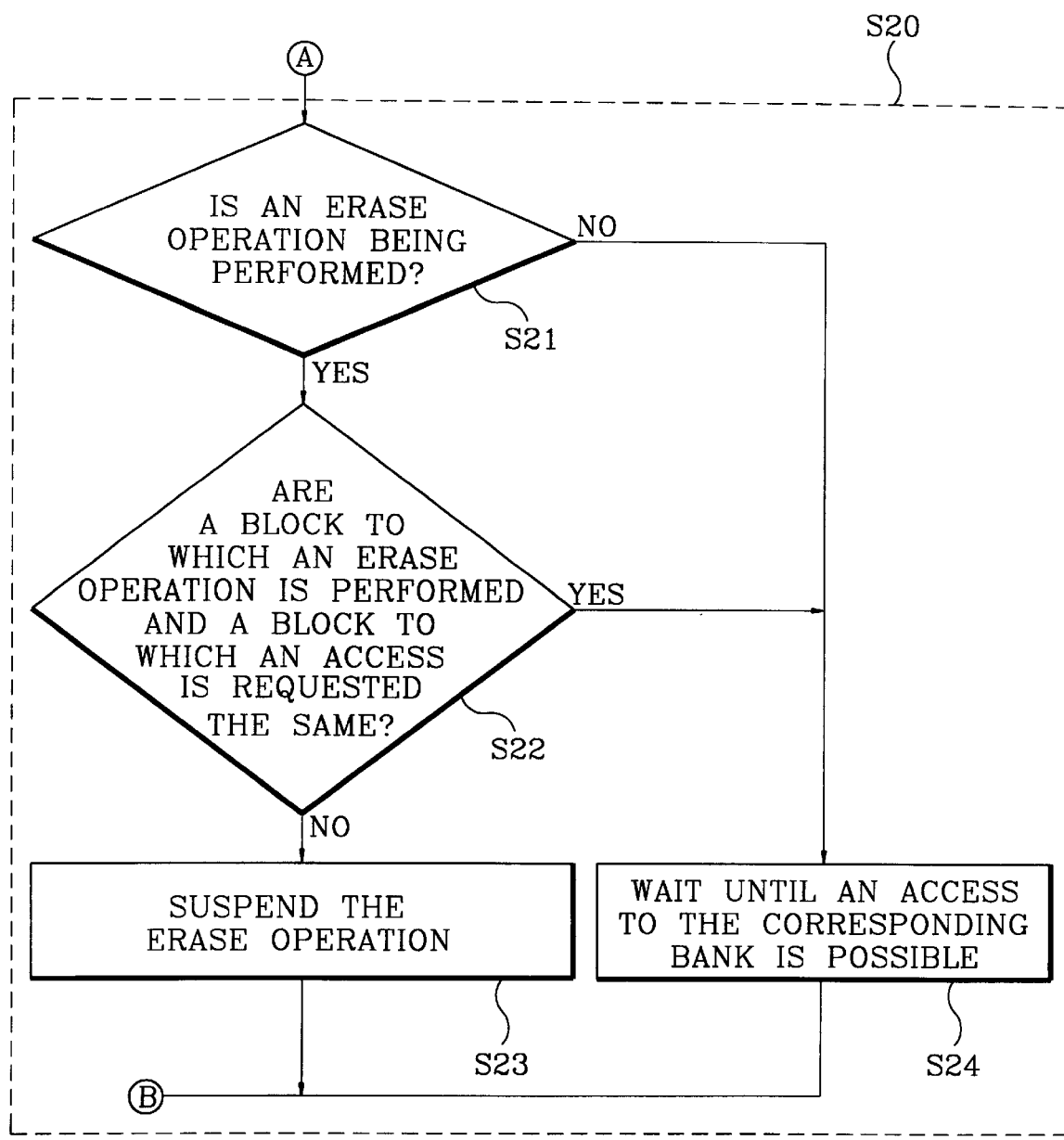

FIG. 4 is a flow chart for explaining a real time processing method of a flash memory according to an embodiment of the present invention.

As shown in FIG. 4, a method according to an embodiment of the present invention comprises steps of determining whether an access to a flash memory is possible if an access to a certain block of the flash memory is requested in order to perform a read/write operation (S10); determining whether an erase operation is performed with respect to a present flash memory if the access to the flash memory is impossible in the step S10, and suspending the erase operation if the erase operation is being performed (S20); performing the read/write operation by accessing the flash memory if the access to the flash memory is possible in the step S10 or if the erase operation to the flash memory is suspended in the step S20 (S30); and resuming the erase operation which is suspended in the step S20 if the step S30 is finished (S40).

Here, the step S10 includes substeps of inputting the access request to the certain block of a double bank flash memory in order to perform the read/write operation (S11); determining in which bank of a first bank and a second bank the block to which the access is requested is contained (S12); and determining whether the access to the bank is possible (S13).

Further, the step S20 comprises substeps of determining whether the erase operation is performed to the present bank if the access to the bank is impossible in substep S13 (S21); determining if the block in which the erase operation is being performed and the block to which the access is requested are the same (S22); suspending the erase operation which is performed to the present bank if the two blocks in substep S22 are not the same (S23); and waiting till the access to the bank is possible if the erase operation is not performed to the present bank in the substep S21, or if the two blocks in the substep S22 are the same (S24).

Further, in the step S30, the read/write operation is performed by accessing the bank if the access to the bank is possible in the substep S13, or if the erase operation which is performed to the bank in the substep S23 is suspended, or if the access to the bank in the substep S24 is possible.

Further, the step S40 includes substeps of determining whether there is a suspended erase operation (S41); and resuming the erase operation if there is the suspended erase operation in the substep S41 (S42).

Operations and effects of the method according to the embodiment of the present invention are as follows.

Figure 1A:
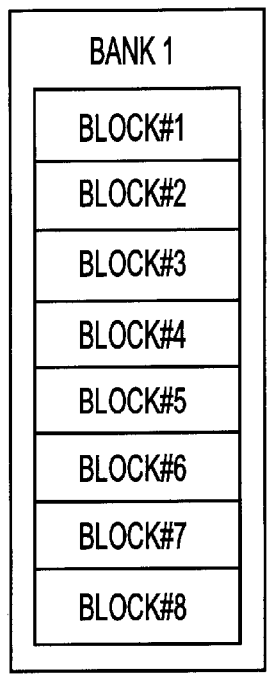
FIG. 1A–FIG. 1D are views for showing a structure of a single bank flash memory and a double bank flash memory in general.
Figure 1B:
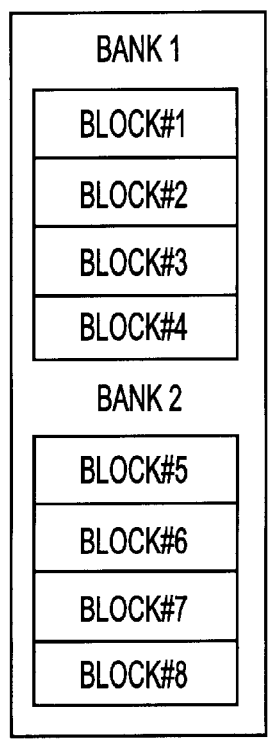
Figure 1C:
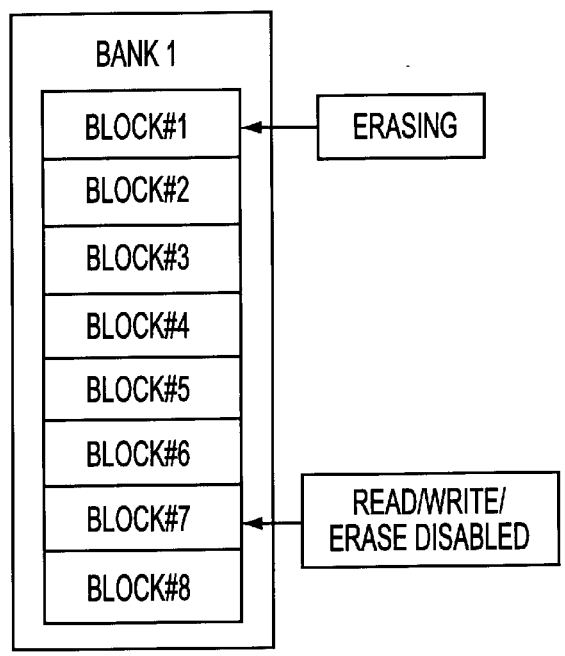
Figure 1D:
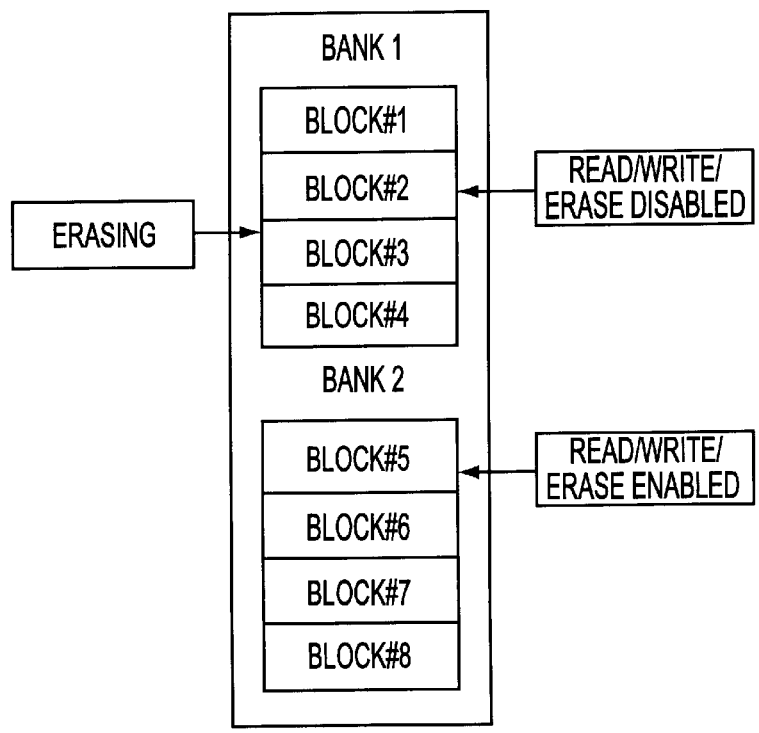
Figure 2:
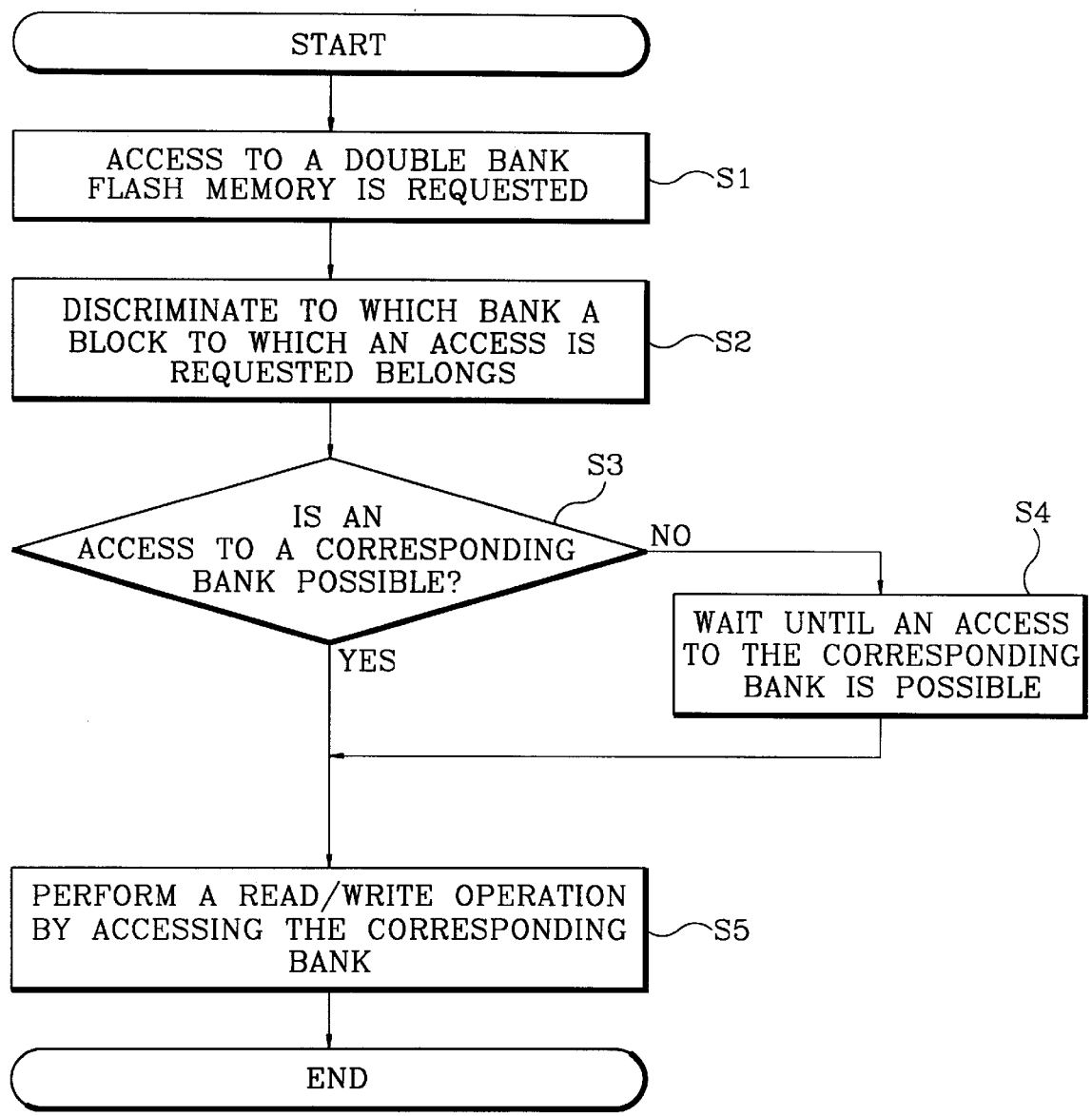
FIG. 2 is a flow chart for explaining operations of a general double bank flash memory.
Figure 3:
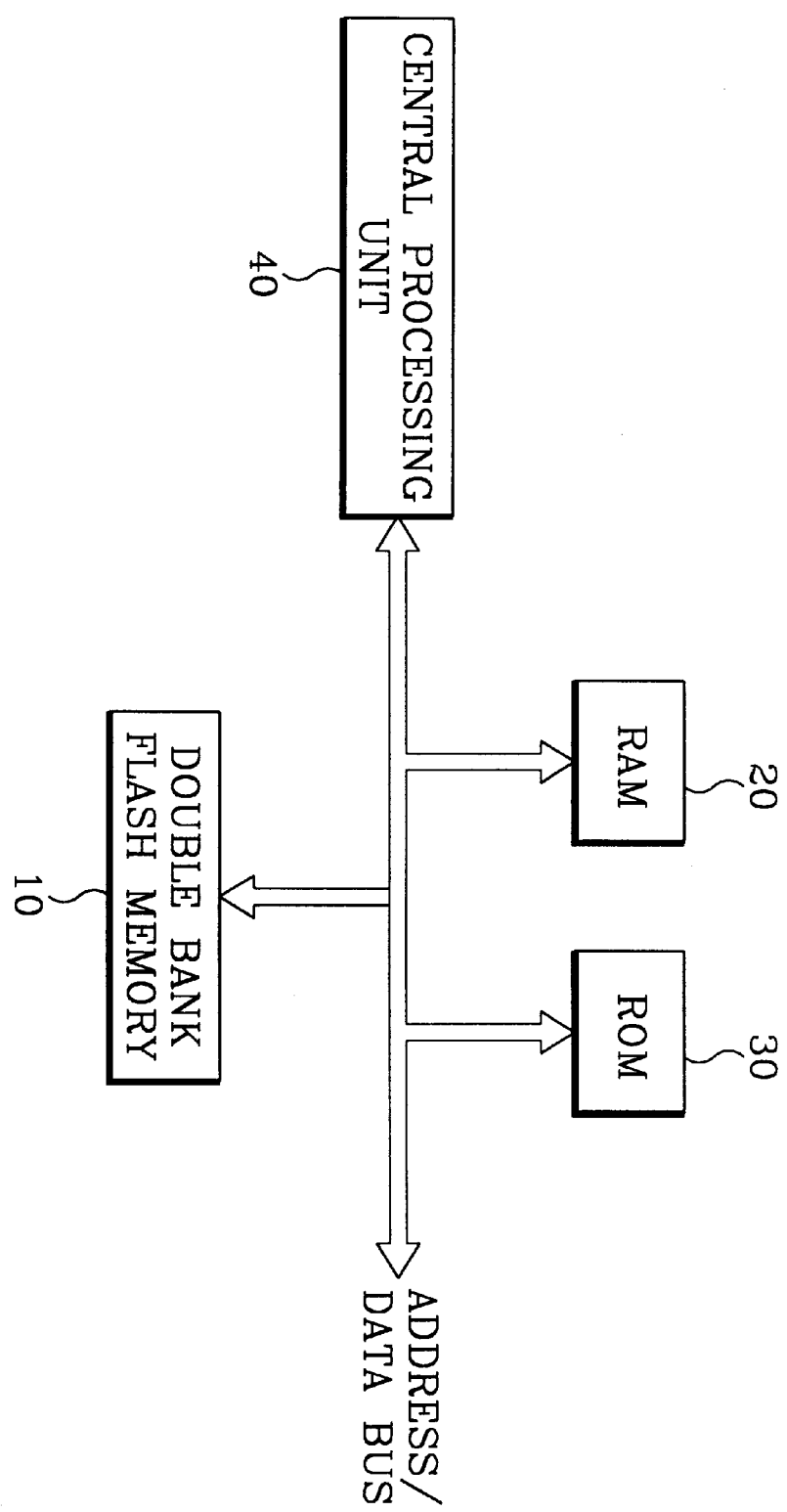
FIG. 3 is a block diagram for schematically showing a general double bank flash memory.

FIG. 3 is a block diagram for schematically showing a general double bank flash memory. As shown in FIG. 3, a central processing unit 40 controls entire operations of a flash memory 10 and its peripheral constituents such as a RAM 20 and a ROM 30.

Here, the double bank flash memory 10 to which the embodiment according to the present invention is applied uses a fixed mapping in which a logical address of a block corresponds to a physical address.

Accordingly, in order to update the contents of a block, the central processing unit 40 backs up contents of the the block which is to be erased into the RAM 20, erases the contents of the block, and stores into the block data which is updated and data which is not necessary to be updated from the backed-up data.

Further, the method according to an embodiment of the present invention performs an access control through a bank discrimination by using the double bank flash memory 10. Since the two banks are discriminated in use, occurrence of an access time delay may be prevented as an application program is performed.

Accordingly, in the method according to an embodiment of the present invention, as the access to the block of a double bank flash memory is requested in order to perform the read/write operation (S11), the central processing unit 40 discriminates to which bank of a first bank and a second bank the block that the access is requested belongs (S12), and determines whether the access to the bank is possible, that is, whether a write, a read, or an erase operation is being performed to the bank (S13).

At this time, if an access to the bank is impossible since a write, a read, or an erase operation is being performed to the bank in the substep S13, access to the bank is derived until the access becomes possible by completion of the write, the read, or the erase operation which is being performed (S24), and then the write, the read, or the erase operation is performed by accessing a block of the bank (S30).

That is, through the above access control, since data can be written in a bank while an erase operation of erasing data to a different bank is performed, an access delay and an access error can be reduced.

However, in the same bank, in case that a read/write operation is performed to a block while an erase operation is performed to a different block, since the read/write operation can be performed after completing the erase operation, an access delay time is prolonged, to thereby make a real time processing of data difficult.

In order to solve the above problem, the method according to an embodiment of the present invention, as shown in FIG. 4, further comprises substeps S21, S23, S41, and S42 to reduce an access delay.

That is, in the substep S21, a determination is made whether an erase operation is being performed to a present corresponding bank if an access to the bank is impossible since a read, a write, or an erase operation is performed to the bank in the substep S13.

In the substep S23, the erase operation is suspended if the erase operation is being performed to the bank in the substep S21, and in the substep S24, the access is delayed until the read/write operation is finished, that is, until the access to the bank is possible, if the read/write operation is performed.

Accordingly, if an access to a corresponding bank is possible, that is, if the read, the write, or the erase operation is not performed to the corresponding bank in the substep S13, or if the erase operation which is performed in the substep S23 is suspended, or if the read/write operation which is performed to the bank in the substep S24 is completed, the read/write operation is performed by accessing a block of the corresponding bank (S30).

After the completion of the read/write operation by accessing the block of the bank (S30), a determination is made whether there is a suspended erase operation (S41), and the erase operation is resumed and completed if there is a suspended erase operation (S42).

At this time, in the substep S21, if the read/write operation is being performed rather than performing an erase operation to the bank, access should be delayed until the read/write operation is completed as stated above, that is, until an access to the bank is possible. However, the waiting time is so short that an access delay does not occur.

That is, through the above real time access control, if, in the same bank, an access to a block is requested for a read/write operation while an erase operation is performed to a different block, the erase operation is instantly suspended, the read/write operation is performed, and then the erase operation is resumed. Therefore, an access delay is sufficiently reduced that the data read/write operation may be processed in real time.

However, if an access to a block for a read/write operation is requested while an erase operation is performed with respect to the same block, an access error may occur.

For example, if a write operation with respect to a block of number 3 in the first bank is requested on the way that an erase operation is performed with respect to a block of number 3 in the same bank, since the erase operation is instantly suspended, the write operation is performed, and the erase operation is resumed, an access error occurs since no data is stored in the flash memory even when in a write command from an application program.

In order to solve the problem, the method according to an embodiment of the present invention further comprises the substep S22 as shown in FIG. 4, so that the access error may be reduced.

Accordingly, the method according to an embodiment of the present invention includes the substep S22 for determining whether a block to which an erase operation is performed and a block to which an access is requested are the same if the erase operation is performed in a corresponding bank in the substep S21.

If the block to which the erase operation is performed and the block to which an access is requested are not the same in the substep S22, the erase operation which is performed in the present corresponding bank is suspended (S23).

The operation is suspended until the read/write operation is completed, that is until an access to the corresponding bank is possible, if the read/write operation is performed with respect to the present corresponding bank in the substep S21, and the operation is delayed until the erase operation is completed, that is, until an access to the corresponding bank is possible, if the block to which the erase operation is performed and the block to which an access is requested are the same (S24).

Accordingly, if the access to the corresponding bank is possible, that is, if the read, the write, or the erase operation is not performed in the corresponding bank in the substep S13, or if the erase operation which is performed in the substep S23 is suspended, or if the read/write operation which is performed in the bank in the substep S24 is completed, the read/write operation is performed by accessing a block of the corresponding bank (S30).

Through the above real time access control, if a block of a corresponding bank to which an erase operation is performed and a block of the corresponding bank to which an access is requested are the same, the erase operation is suspended and the read/write operation is performed by accessing the block of the corresponding bank, so that an access error may be reduced.

Accordingly, by the method of the present invention, if an access to a block of a bank is requested for a read/write operation while an erase operation is performed with respect to a different block of the same bank, the erase operation is instantly suspended, the read/write operation is performed by accessing the block of the corresponding bank, and then the erase operation is resumed, so that the access delay is reduced. Further, if an access to a block of a bank is requested while an erase operation is performed with respect to a different block of the same bank, the erase operation is suspended, and then the read/write operation is performed by accessing the corresponding block of the bank, so that an access error is reduced.

As stated above, in the method of the present invention, if an access to a block of a flash memory is requested for a read/write operation while an erase operation is performed with respect to a different block of the same memory, the erase operation is instantly suspended, the read/write operation is performed first, and then the erase operation is resumed, to thereby reduce an access delay and an access error. Therefore, a data read/write operation is processed in real time.

What is claimed is:

1. A real time processing method of a flash memory, comprising the steps of:

(1) determining whether an access to the flash memory is possible when the access to a block of the flash memory is requested in order to perform a read/write operation;

(2) determining whether an erase operation is performed in the flash memory when the access to the flash memory is impossible in the step (1), and suspending the erase operation when the erase operation is being performed;

(3) performing the read/write operation by accessing the flash memory when the access to the flash memory is possible in the step (1) or when the erase operation in the flash memory is suspended in the step (2); and (4) resuming the erase operation if it was suspended in the step (2) when the step (3) is finished;

wherein the flash memory has double banks;

wherein the step (1) includes the substeps of:

(1-1) requesting access to the block of the double bank flash memory to perform the read/write operation;

(1-2) discriminating which bank of a first bank and a second bank the block to which the access is requested belongs; and (1-3) determining whether the access to the discriminated bank is possible; and wherein the step (2) includes the substeps of:

(2-1) determining whether the erase operation is being performed in the discriminated bank when the access to the discriminated bank is impossible in the substep (3);

(2-2) determining whether a block to which the erase operation is being performed and the block to which the access is requested are the same when the erase operation to the discriminated bank is being performed in the substep (2-1);

(2-3) suspending the erase operation which is being performed in the discriminated bank when the block to which the erase operation is being performed and the block to which the access is requested are different in the substep (5); and (2-4) waiting until the access to the discriminated bank is possible when the erase operation in the bank is suspended in the substep (2-1) or when the block to which the erase operation is being performed and the block to which the access is requested are the same in the substep (5).

2. The real time processing method as claimed in claim 1, wherein the step (3) performs the read/write operation by accessing the discriminated bank if the access to the discriminated bank is possible in the substep (1-3) or if the erase operation to the bank is suspended in the substep 2-3.

3. The real time processing method as claimed in claim 2, wherein the step (4) includes substeps of:

(4-1) determining whether said erase operation was suspended; and (4-2) resuming the erase operation if there is the suspended erase operation in the substep (4-1).

* * * * *